United States Patent
Lee et al.

(10) Patent No.: US 11,437,413 B2
(45) Date of Patent: Sep. 6, 2022

(54) DISPLAY DEVICE INCLUDING PATH CHANGE CIRCUIT

(71) Applicant: LG Display Co., Ltd., Seoul (KR)

(72) Inventors: Cheolho Lee, Paju-si (KR); Sunhwan Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/126,995

(22) Filed: Dec. 18, 2020

(65) Prior Publication Data

US 2021/0202531 A1 Jul. 1, 2021

(30) Foreign Application Priority Data

Dec. 31, 2019 (KR) .................. 10-2019-0179690

(51) Int. Cl.
*H01L 27/24* (2006.01)
*H01L 27/12* (2006.01)
*H01L 23/00* (2006.01)

(52) U.S. Cl.
CPC ............ *H01L 27/124* (2013.01); *H01L 24/16* (2013.01); *H01L 2224/16145* (2013.01)

(58) Field of Classification Search
CPC ............... H01L 27/124; H01L 24/16; H01L 2224/16145; H01L 2224/16237; H01L 2224/32225; H01L 2224/73204; G09F 9/30; G09G 3/20; G09G 3/2092; G09G 3/32; G09G 2310/0243; G09G 2310/06
USPC ........................................................ 257/40
See application file for complete search history.

(56) References Cited

U.S. PATENT DOCUMENTS

| | | |
|---|---|---|
| 5,844,314 A | 12/1998 | Kim |
| 6,083,666 A | 7/2000 | Kim |
| 8,877,570 B2 | 11/2014 | Kim et al. |
| 9,472,579 B2 | 10/2016 | Kim et al. |
| 2007/0008478 A1 | 1/2007 | Lee et al. |
| 2007/0035494 A1* | 2/2007 | Chang ................. G02B 30/24 348/E13.059 |
| 2007/0195030 A1* | 8/2007 | Huang ................. G09G 3/3648 345/87 |
| 2008/0012812 A1* | 1/2008 | Kawata ............... G09G 3/3648 345/90 |

(Continued)

FOREIGN PATENT DOCUMENTS

| | | |
|---|---|---|
| CN | 1897097 A | 1/2007 |
| CN | 103135304 A | 6/2013 |

(Continued)

OTHER PUBLICATIONS

China National Intellectual Property Administration, First Office Action, Chinese Patent Application No. 202011492513.0, dated Jun. 30, 2022, eight pages.

*Primary Examiner* — Lex H Malsawma
*Assistant Examiner* — Laura M Dykes
(74) *Attorney, Agent, or Firm* — Fenwick & West LLP

(57) ABSTRACT

A display device includes a display panel including a display area and a non-display area, a first output pad set, a second output pad set, and a buffer pad set that are disposed in the non-display area, and a path change circuit. In an exemplary embodiment, the path change circuit is configured to change a signal delivery path such that a signal delivered through the first output pad set or the second output pad set is delivered through the buffer pad set, when an enable signal is input.

20 Claims, 5 Drawing Sheets

(56) References Cited

U.S. PATENT DOCUMENTS

| | | |
|---|---|---|
| 2011/0079799 A1 | 4/2011 | Lee et al. |
| 2015/0187803 A1* | 7/2015 | Moh .................. G02F 1/13452 257/43 |
| 2016/0043153 A1 | 2/2016 | Min |
| 2017/0270863 A1 | 9/2017 | Suh et al. |

FOREIGN PATENT DOCUMENTS

| | | | |
|---|---|---|---|
| CN | 111650793 A | * | 9/2020 |
| JP | 2007-240459 A | | 9/2007 |
| KR | 1998-0048656 A | | 9/1998 |
| KR | 10-2007-0120385 A | | 12/2007 |

\* cited by examiner

DISPLAY DEVICE INCLUDING PATH CHANGE CIRCUIT

CROSS-REFERENCE TO RELATED APPLICATIONS

This application claims priority to and the benefit of Republic of Korea Patent Application No. 10-2019-0179690, filed on Dec. 31, 2019, the disclosure of which is incorporated herein by reference in its entirety.

BACKGROUND

1. Field

The present disclosure relates to a display device, and more particularly, to a display device that may prevent line defects.

2. Background

Typical examples of a display device may include a liquid crystal display (LCD) device, a plasma display panel (PDP) device, a field emission display (FED) device, an electro luminescence display (ELD) device, an electro-wetting display (EWD) device, an organic light emitting display (OLED) device and the like.

Display devices include data lines, gate lines, a display panel including a plurality of pixels connected to the date lines and the gate lines, a gate driver configured to supply gate signals to the gate lines, a data driver configured to supply data voltages to the data lines, and a timing controller configured to control an operation timing of the gate driver and data driver.

The data driver includes at least one source drive integrated circuit (IC). The source drive IC may be mounted onto a substrate using a chip-on-glass (COG) or chip-on-plastic (COP) method.

To deliver an electric signal to the timing controller or the display panel, the source drive IC needs to electrically contact the substrate. Accordingly, a bump disposed at the source drive IC electrically contacts a pad on the substrate.

The bump of the source drive IC and the pad on the substrate adhere to each other through an anisotropic conductive film (ACF). Conductive balls, which are conductive particles, are scattered in large numbers at the anisotropic conductive film such that an electric signal is delivered between the bump of the source drive IC and the pad on the substrate.

In a process of manufacturing the display device, a foreign substance in addition to the anisotropic conductive film may be inserted between the bump of the source drive IC and the pad on the substrate. Additionally, the conductive balls may be unevenly distributed at the anisotropic conductive film used during the manufacturing process, or the anisotropic conductive film may be unevenly distributed between the bump of the source drive IC and the pad on the substrate. For this reason, bonding resistance between the bump of the source drive IC and the pad on the substrate may increase. Accordingly, a signal may not be properly delivered between the bump of the source drive IC and the pad on the substrate. Further, the bonding resistance between the bump of the source drive IC and the pad on the substrate may increase due to temperature or humidity while the display device is being driven, regardless of initial contact between the bump of the source drive IC and the pad on the substrate.

In case a signal is not properly delivered between the bump of the source drive IC and the pad on the substrate due to the increase in the bonding resistance between the bump of the source drive IC and the pad on the substrate, line defects, where an image is not properly displayed on entire pixels connected with the data line that is configured to receive image signals through the pad on the substrate, may occur.

SUMMARY

The present disclosure is directed to a display device that may prevent line defects even though bonding resistance between some bumps of a data driver and some pads on a substrate increases.

Aspects of the present disclosure are not limited to the above-described ones. Additionally, other aspects and advantages that have not been mentioned may be clearly understood from the following description and may be more clearly understood from embodiments. Further, it will be understood that the aspects and advantages of the present disclosure may be realized via means and combinations thereof that are described in the appended claims.

A display device according to an embodiment may include a display panel including a display area and a non-display area, a first output pad set, a second output pad set, a buffer pad set and a path change circuit, wherein the first output pad set, the second output pad set and the buffer pad set are disposed in the non-display area.

In an embodiment, the path change circuit may change a signal delivery path such that a signal, delivered through the first output pad set or the second output pad set, is delivered through the buffer pad set, when an enable signal is input.

A display device according to another embodiment may include a first output pad set including a plurality of output pads, a second output pad set including a plurality of output pads, a buffer pad set including a plurality of buffer pads, a first enable pad to which a first enable signal is input, a second enable pad to which a second enable signal is input, a first switching element connected with the first enable pad and connected respectively between the output pad included in the first output pad set and the buffer pad included in the buffer pad set, and a second switching element connected with the second enable pad and connected respectively between the output pad included in the second output pad set and the buffer pad included in the buffer pad set.

In another embodiment, when the first enable signal or the second enable signal is input, a signal, delivered through the first output pad set or the second output pad set, may be delivered through the buffer pad set.

A display device according to yet another embodiment may include a display panel including a display area and a non-display area, a first output pad set disposed in the non-display area and including a plurality of output pads, a second output pad set disposed in the non-display area and including a plurality of output pads, a buffer pad set disposed in the non-display area and including a plurality of buffer pads, and a path change circuit configured to change a signal delivery path such that a signal, delivered through each output pad included in the first output pad set or through each output pad included in the second output pad set, is delivered through each buffer pad included in the buffer pad set, when an enable signal is input.

The display device according to the present disclosure may prevent line defects even though bonding resistance between some bumps of a data driver and some pads on a substrate increases.

BRIEF DESCRIPTION OF THE DRAWINGS

The accompanying drawings constitute a part of this specification, illustrate one or more embodiments of the present disclosure, and together with the specification, explain the present disclosure.

DETAILED DESCRIPTION

Figure 1:
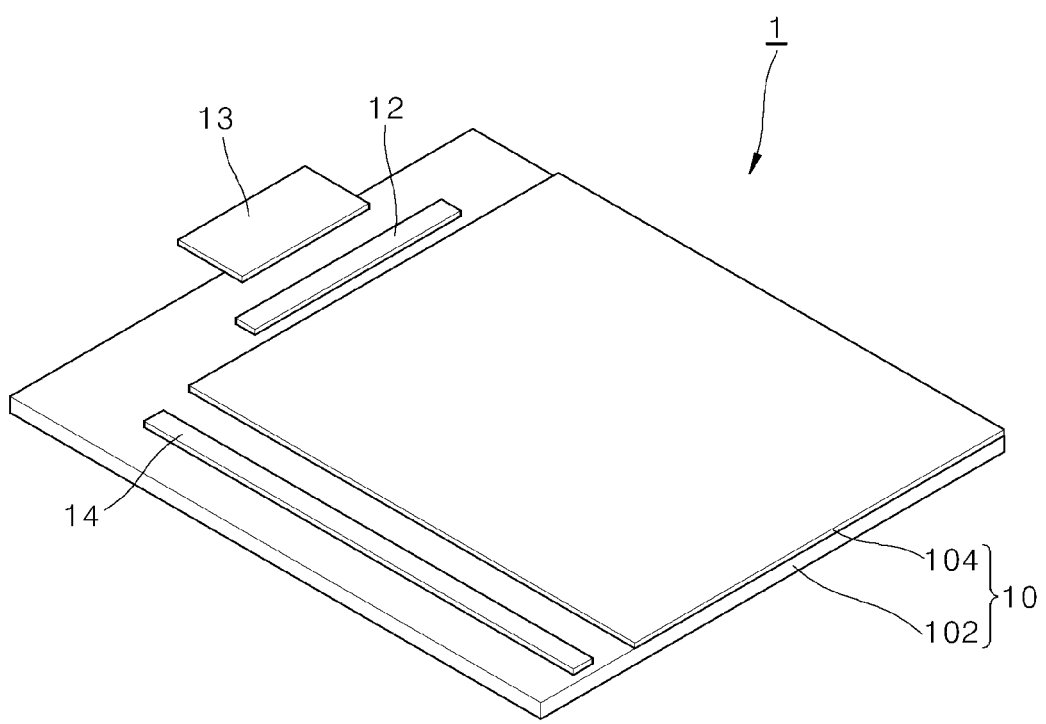
FIG. 1 is a perspective view illustrating a display device according to an embodiment.

Advantages and features of the present disclosure and a method of achieving the same may be clearly understood from embodiments that are described with reference to the accompanying drawings. The present disclosure, however, may be implemented in various different forms, and should not be construed as being limited only to the embodiments set forth herein. Rather, these embodiments are provided as examples so that the present disclosure may be thorough and complete and that the scope of the disclosure will be fully conveyed to one having ordinary skill in the art to which the disclosure pertains. The present disclosure should be defined only according to the scope of the appended claims.

The shapes, sizes, ratios, angles and number of components illustrated in the drawings for describing embodiments of the present disclosure are given only as examples, and the present disclosure is not limited to details set forth herein. Throughout the specification, like reference numerals denote like components. In describing the present disclosure, detailed description of well-known technologies including related arts will be omitted if it is deemed to make the gist of the disclosure unnecessarily vague. Throughout the specification, unless explicitly indicated otherwise, the terms "comprise", "have", "being comprised of" and the like should imply the inclusion of any other component but not the exclusion of any other component, and the singular forms "a", "an" and "the" are intended to include the plural forms as well.

In describing a component, the margin of error should be considered though not explicitly described.

In describing components of the present disclosure, terms such as first, second and the like may be used. These terms are only intended to distinguish a component from another component, and the components are not limited according to such terms. Certainly, a first component described below may be a second component within the technical spirit of the disclosure.

Features of various embodiments of the disclosure may be partially or entirely mixed or combined, and may be technically linked and connected in various ways. Further, each embodiment may be implemented independently, or in connection with each other.

FIG. 1 is a perspective view illustrating a display device according to an embodiment. Further, FIG. 2 is a schematic view illustrating a configuration of a display device according to an embodiment.

The display device according to an embodiment of the present disclosure may be implemented as various types of display devices. The display device, for example, may be implemented as a liquid crystal display device, an organic light emitting display device, an electrophoretic display device, an electro-wetting display device, a quantum dot display device, a micro-light emitting display device and the like. Additionally, the display device may be implemented as a flexible display, a rollable display, a bendable display, a foldable display, a wearable display, an automotive display and the like.

Figure 2:
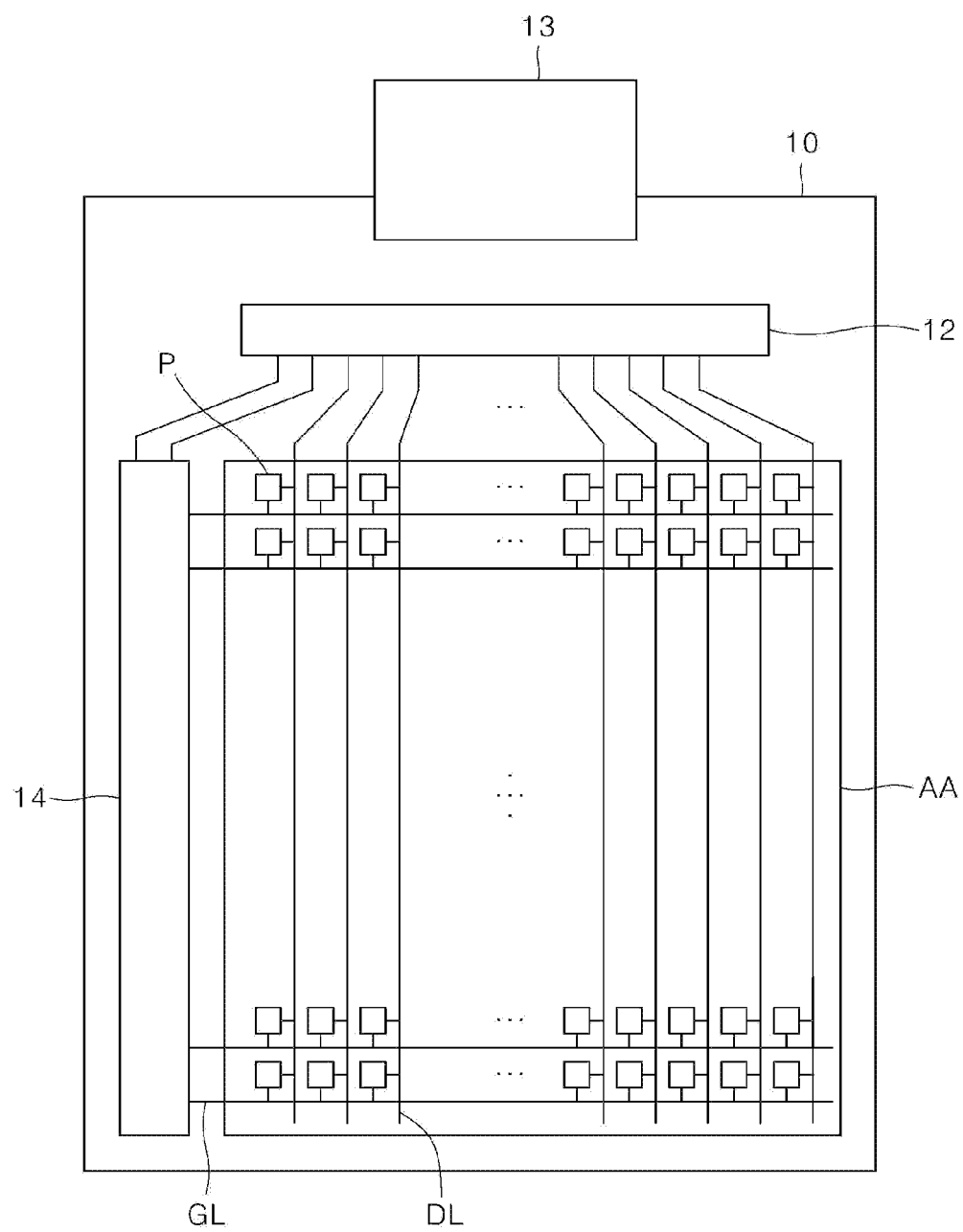
FIG. 2 is a schematic view illustrating a configuration of a display device according to an embodiment.

Referring to FIGS. 1 and 2, the display device 1 according to an embodiment may include a display panel 10, a data driver 12, a circuit board 13, and a gate driver 14.

The display panel 10 may comprise a first substrate 102 and a second substrate 104.

The first substrate 102 may be made of glass having rigidity or a polymer resin, or may be implemented as a film having flexibility, but is not limited thereto. The film having flexibility, for example, may be made of plastics and polyimides but is not limited thereto.

In case the first substrate 102 is made of plastics, the first substrate 102 may comprise a support substrate such as a polyethylene terephthalate-based substrate, a polyimide film, and a bonding film such as a pressure sensitive adhesive for bonding the polyethylene terephthalate-based substrate and the polyimide film. The second substrate 104 may be an encapsulation film or a barrier film.

Data lines (DL) and gate lines (GL) may be formed at the first substrate 102. The data lines (DL) may be configured to cross the gate lines (GL). Pixels (P) may be formed in an area defined by the gate lines (GL) and the data lines (DL) that are crossed. A display area (AA) may denote an area where pixels (P) are provided and display an image, and a non-display area may denote the rest area except the display area.

Pads may be formed in a non-display area of the first substrate 102. Some of the pads may connect with bonding pads, and some other pads may connect with the data lines (DL).

The data driver 12 may adhere to the first substrate 102 through a chip-on-glass (COG) or chip-on-plastic (COP) process. In some embodiments, the data driver 12 may adhere to the first substrate 102 through another process. The data driver may comprise at least one source drive integrated circuit (IC).

The data driver 12 may adhere to the non-display area of the first substrate 102 using an anisotropic conductive film. Input bumps and output bumps of the data driver 12 may respectively contact some of the pads of the first substrate 102 through the anisotropic conductive film.

The data driver 12 may receive a digital video data, may convert the digital video data into analogue data voltages, and may deliver the analogue data voltages to the data lines (DL).

In FIG. 1, a plurality of data drivers 12 may adhere to the first substrate 102.

The circuit board 13 may adhere to the non-display area of the first substrate 102 using an anisotropic conductive film. Bonding bumps of the circuit board 13 may contact some of the pads of the first substrate 102 through the anisotropic conductive film. The circuit board 13 may be a flexible printed circuit board or a rigid printed circuit board.

The gate driver 14 may be disposed in the non-display area of the first substrate 102 using the gate driver in panel (GIP) technology. In another embodiment, the gate driver 14 may connect with the first substrate 102 with another technology rather than the GIP technology.

The gate driver 14 may receive gate control signals through gate control lines. The gate driver 14 may generate gate signals and may consecutively output the gate signals to the gate lines (GL) according to the gate control signals.

Figure 3:
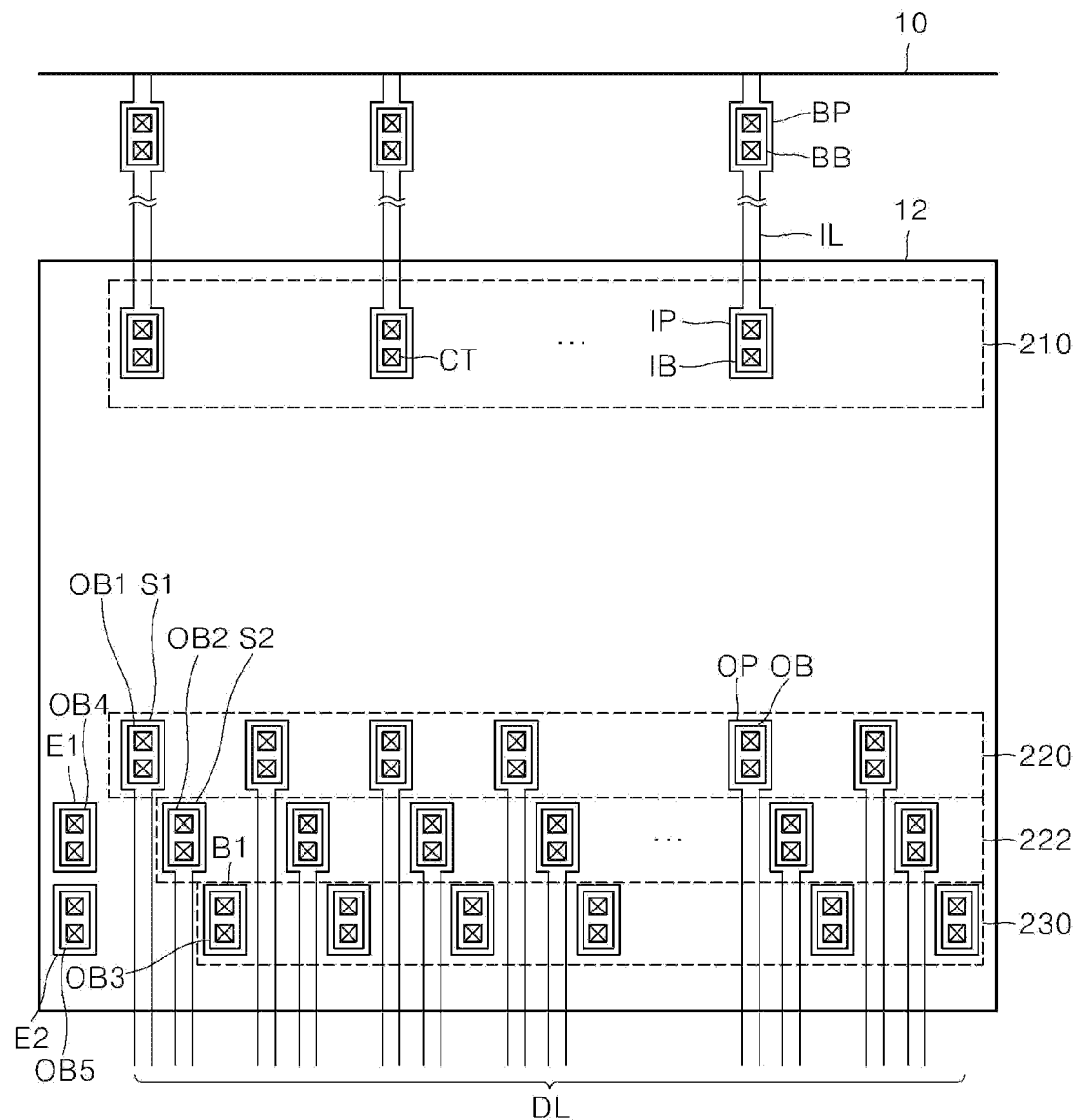
FIG. 3 is a view illustrating a connection between a data driver and pads on a substrate of a display device according to an embodiment.

FIG. 3 is a view illustrating a connection between a data driver and pads on a substrate of a display device according to an embodiment.

Referring to FIG. 3, in the non-display area of the display panel 10, bonding pads (BP), input pads (IP), output pads (OP), input lines (IL), and data lines (DL) are respectively disposed.

At least one contact hole (CT) may be formed at each of the bonding pads (BP), input pads (IP) and output pads (OP). The number of the output pads (OP) may differ from the number of the input pads (IP). For example, the number of the output pads (OP) may be larger than the number of the input pads (IP).

The bonding pads (BP) may be formed at one end of the display panel 10 and may connect with bonding bumps (BB) of the circuit board 13 through an anisotropic conductive film. Accordingly, voltages and signals from the circuit board 13 may be supplied to the bonding pads (BP).

The input pads (IP) may connect to the bonding pads (BP) through the input lines (IL). Each of the input pads (IP) may connect to each of the bonding pads (BP) through each of the input lines (IL) on a one-to-one basis. Accordingly, electric signals from the circuit board 13, which are supplied to the bonding pads (BP), may be supplied to the input pads (IP). In this specification, a collection of the input pads (IP) is referred to as an input pad set 210.

The input bumps (IB) of the data driver 12 may connect to the input pads (IP) through an anisotropic conductive film. Each of the input bumps (IB) of the data driver 12 may connect to each of the input pads (IP) on a one-to one basis. Accordingly, the data driver 12 may receive electric signals, supplied from the circuit board 13 to the input pads (IP), through the input bumps (IB).

In some embodiments, electric signals output from the data driver 12 may be delivered to the input lines (IL) through the input bumps (IB) and the input pads (IP).

The output pads (OP) may connect to the data lines (DL). Each of the output pads (OP) may connect to each of the data lines (DL) on a one-to-one basis. The data lines (DL) of the non-display area may connect to data lines (DL) of the display area (AA).

The output bumps (OB) of the data driver 12 may connect to the output pads (OP) through an anisotropic conductive film. Each of the output bumps (OB) of the data driver 12 may connect to each of the output pads (OP) on a one-to-one basis. Accordingly, electric signals, output by the data driver 12 through the output bumps (OB), may be delivered to the data lines (DL) through the output pads (OP).

In some embodiment, the electric signals, delivered through the data lines (DL), may be delivered to the data driver 12 through the output pads (OP) and the output bumps (OB).

In the display device according to an embodiment, the output pads (OP), as illustrated in FIG. 3, may be divided and arranged in two rows. In this specification, a collection of the output pads (OP) in an uppermost row may be referred to as a first output pad set 220, and a collection of the output pads (OP) in the following row may be referred to as a second output pad set 222.

Each of the output pads included in the first output pad set 220, and each of the output pads included in the second output pad set 222 may respectively supply a data voltage to each pixel of the display panel 10 through the data line (DL).

In the display device according to an embodiment, a buffer pad set 230 including a plurality of buffer pads may be disposed in a row next to the row of the second output pad set 222. Further, a first enable pad (E1) and a second enable pad (E2) may be disposed at one side of the buffer pad set 230. Each buffer pad included in the buffer pad set 230, and the first enable pad (E1) and the second enable pad (E2) may respectively connect to output pads (OP) of the source driver IC 12 through an anisotropic conductive film.

Each of the buffer pads included in the buffer pad set 230 may connect to the data line (DL) connected with each of the output pads included in the first output pad set 220, and to the data line (DL) connected with each of the output pads included in the second output pad set 222.

Each of the buffer pads included in the buffer pad set 230 may be activated by a first enable signal input through the first enable pad (E1) or by a second enable signal input through the second enable pad (E2). Unless the first enable signal or the second enable signal is input, each of the buffer pads included in the buffer pad set 230 is not activated but kept inactivated.

In case each of the buffer pads included in the buffer pad set 230 is kept inactivated, a signal input through each buffer pad may not be delivered to any data line (DL). In case the first enable signal is input through the first enable pad (E1) and each buffer pad is activated, a signal input through each buffer pad may be output to the data line (DL) connected with each output pad included in the first output pad set 220. In case the second enable signal is input through the second enable pad (E2) and each buffer pad is activated, a signal input through each buffer pad may be output to the data line (DL) connected with each output pad included in the second output pad set 222.

Figure 4:
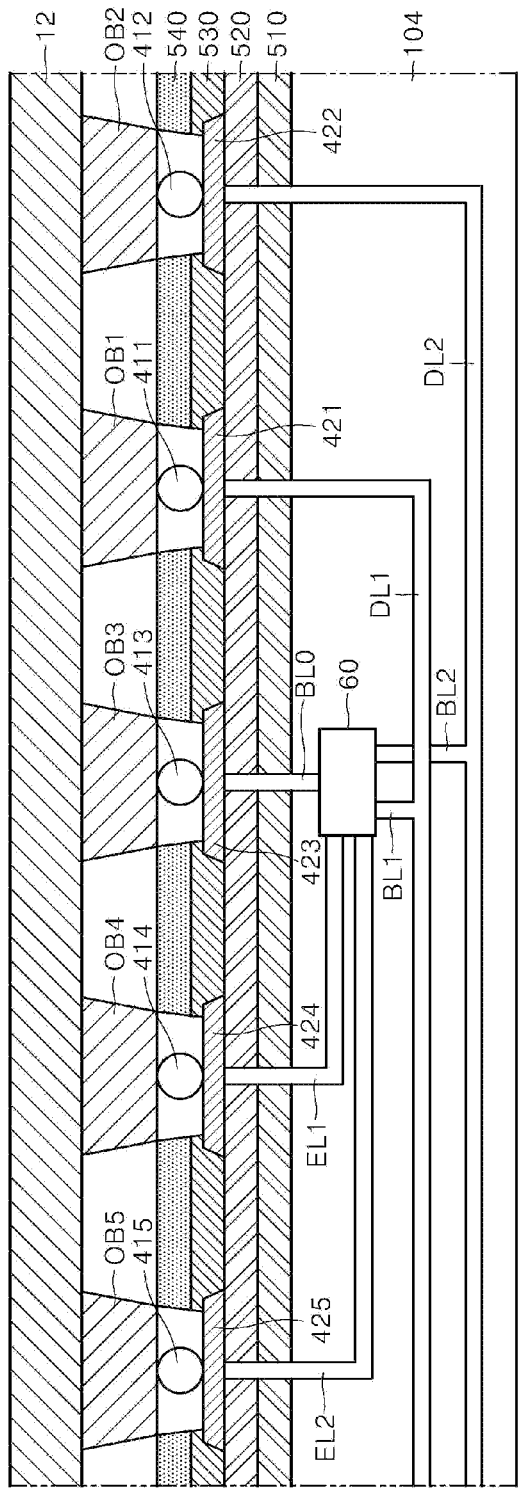
FIG. 4 is a cross-sectional view illustrating a state in which a data driver and pads on a substrate of a display device according to an embodiment contact each other.

FIG. 4 is a cross-sectional view illustrating a state in which a data driver and pads on a substrate of a display device according to an embodiment contact each other.

FIG. 4 respectively describes a first output pad (S1) that is one of the output pads included in the first output pad set 220, and a second output pad (S2) that is one of the output pads included in the second output pad set 222, among the components illustrated in FIG. 3. Further, FIG. 4 respectively describes a buffer pad (B1) among the buffer pads included in the buffer pad set 230 and a first enable pad (E1) and a second enable pad (E2) that correspond to the first output pad (S1) and the second output pad (S2).

Referring to FIG. 4, a buffer film 510 may be formed on the second substrate 104, and a gate insulation film 520 may be formed on the buffer film 510. Additionally, a first interlayer insulation film 530 and a second interlayer insulation film 540 may be formed on the gate insulation film 520. Further, an electrode 421, 422, 423, 424, 425 corresponding to each pad (S1, S2, B1, E1 and E2) may be formed on the gate insulation film 520. That is, a first electrode 421 is an electrode of the first output pad (S1), a second electrode 422 is an electrode of the second output pad (S2). Further, a third electrode 423 is an electrode of the buffer pad (B1), a fourth electrode 424 is an electrode of the first enable pad (E1), and a fifth electrode 425 is an electrode of the second enable pad (E2).

Each electrode 421, 422, 423, 424, 425 may come into contact with each corresponding bump (OB1, OB2, OB3, OB4 and OB5) through a conductive ball 411, 412, 413, 414, 415. Each bump (OB1, OB2, OB3, OB4 and OB5) may be disposed on the data driver 12.

The first electrode 421 of the first output pad (S1) may electrically connect with a first data line (DL1), and the second electrode 422 of the second output pad (S2) may electrically connect with a second data line (DL2). The third electrode 423 of the buffer pad (B1) may electrically connect with a path change circuit 60, and the path change circuit 60 may connect with the first data line (DL1) and the second data line (DL2) respectively through a first buffer line (BL1) and a second buffer line (BL2). Accordingly, the third electrode 423 of the buffer pad (B1) may connect with all the first data line (DL1) and the second data line (DL2) through the path change circuit 60.

The fourth electrode 424 of the first enable pad (E1) may connect with the path change circuit 60 through a first enable line (EL1). The fifth electrode 425 of the second enable pad (E2) may connect with the path change circuit 60 through a second enable line (EL2). The first enable signal input through the fourth electrode 424 of the first enable pad (E1), or the second enable signal input through the fifth electrode 425 of the second enable pad (E2) may be input respectively to the path change circuit 60.

The path change circuit 60 may change a signal delivery path such that a signal delivered through the first output pad set 220 or the second output pad set 222 is delivered through the buffer pad set 230. When a first path change signal is input to the path change circuit 60, a signal delivered through the first output pad set 220 may be delivered through the buffer pad set 230. When a second path change signal is input to the path change circuit 60, a signal delivered through the second output pad set 222 may be delivered through the buffer pad set 230.

If a signal is not delivered through at least one output pad among the output pads included in the first output pad set 220, the first path change signal may be input to the path change circuit 60. Additionally, if a signal is not delivered through at least one output pad among the output pads included in the second output pad set 222, the second path change signal may be input to the path change circuit 60.

Figure 5:
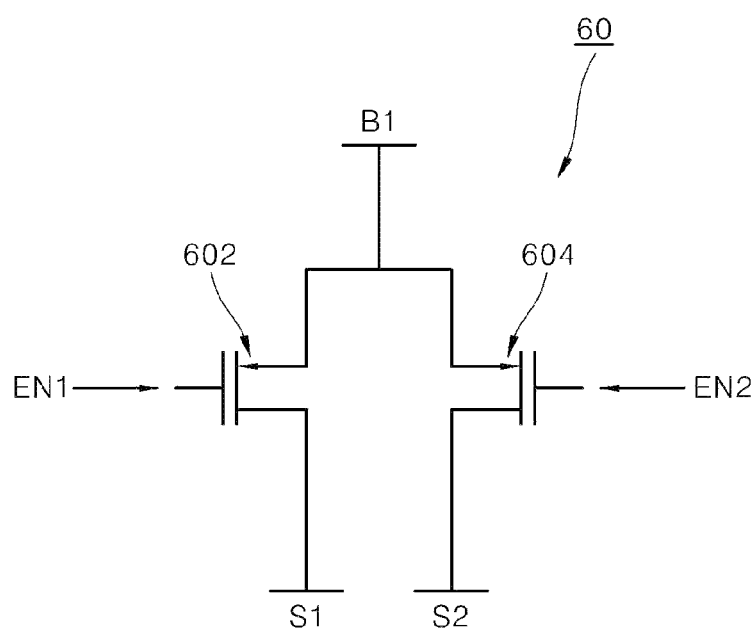
FIG. 5 is a circuit diagram illustrating a path change circuit of a display device according to an embodiment.

FIG. 5 is a circuit diagram illustrating a path change circuit of a display device according to an embodiment.

The path change circuit 60, as illustrated in FIG. 5, may include a first switching element 602 and a second switching element 604. The first switching element 602 may connect between the output pad included in the first output pad set 220 and the buffer pad included in the buffer pad set 230. The second switching element 604 may connect between the output pad included in the second output pad set 222 and the buffer pad included in the buffer pad set 230. For example, in FIG. 4, the first switching element 602 may connect between the first electrode 421 of the first output pad (S1) and the third electrode 423 of the buffer pad (B1), and the second switching element 604 may connect between the second electrode 422 of the second output pad (S2) and the third electrode 423 of the buffer pad (B1).

The first switching element 602 may be turned on by the first enable signal (EN1) input through the first enable pad (E1), and the second switching element 604 may be turned on by the second enable signal (EN2) input through the second enable pad (E2).

When the first switching element 602 is turned on, a signal, delivered through each of the output pads included in the first output pad set 220, may be delivered through each of the buffer pads included in the buffer pad set 230. When the second switching element 604 is turned on, a signal, delivered through each of the output pads included in the second output pad set 222, may be delivered through each of the buffer pads included in the buffer pad set 230.

For example, when the first switching element 602 is turned on in FIG. 4, the third electrode 423 of the buffer pad (B1) may connect with the first data line (DL1) through the path change circuit 60 and the first buffer line (BL1). Then a signal input to the first electrode 421 of the first output pad (S1) may also be input to the third electrode 423 of the buffer pad (B1). The signal input to the third electrode 423 of the buffer pad (B1) may be delivered to the first data line (DL1) through the path change circuit 60 and the first buffer line (BL1).

Likewise, when the second switching element 604 is turned on in FIG. 4, the third electrode 423 of the buffer pad (B1) may connect with the second data line (DL2) through the path change circuit 60 and the second buffer line (BL2). Then a signal input to the second electrode 422 of the second output pad (S2) may also be input to the third electrode 423 of the buffer pad (B1). The signal input to the third electrode 423 of the buffer pad (B1) may be delivered to the second data line (DL2) through the path change circuit 60 and the second buffer line (BL2).

Accordingly, when the first enable signal (EN1) is input to the path change circuit 60, the buffer pad set 230 may perform the same function as the first output pad set 220 while each of the buffer pads included in the buffer pad set 230 is activated. Likewise, when the second enable signal (EN2) is input to the path change circuit 60, the buffer pad set 230 may perform the same function as the second output pad set 222 while each of the buffer pads included in the buffer pad set 230 is activated.

Therefore, as described above, the first enable signal (EN1) or the second enable signal (EN2) may be input to the path change circuit 60, in case a signal is not properly delivered between the bump of the data driver and a specific output pad on the substrate due to increased bonding resistance between the bump of the data driver and the specific output pad on the substrate, which is caused by a foreign substance inserted between the bump of the data driver and the output pad on the substrate, by uneven distribution of the conductive balls at the anisotropic conductive film, by uneven distribution of the anisotropic conductive film between the bump of the data driver and the output pad on the substrate, or by temperature or humidity. Thus, when the buffer pad is activated, the buffer pad may perform the same function as the output pad having increased bonding resistance.

In the above-described configuration, line defects of a display panel may be removed by inputting an enable signal to the path change circuit 60 with no need to waste or repair the display panel having line defects found in a process of manufacturing the display device. Further, in case line defects occur to a display device in use for the above-described reasons, the line defects may be removed by inputting an enable signal to the path change circuit 60 with no need to repair the display device.

The embodiments of the present disclosure have been described with reference to the accompanying drawings. However, the embodiments and the drawings set forth herein are not intended to limit the disclosure. Further, various modifications may be made by one having ordinary skill in the art to which the disclosure pertains within the technical spirit of the disclosure. It should be understood that the embodiments set forth herein are provided as examples to describe the technical spirit of the disclosure not to limit the technical spirit of the disclosure, in all respects. Thus, a scope of the present disclosure should be defined according to the appended claims and all the technical spirit within the scope should be construed as being included in a scope of the right to the disclosure.

What is claimed is:
1. A display device, comprising:
a display panel comprising a display area and a non-display area;

a first output pad set, a second output pad set, and a buffer pad set disposed in the non-display area; and
a path change circuit configured to change a signal delivery path such that a signal, delivered through the first output pad set or the second output pad set, is delivered through the buffer pad set, when an enable signal is input,
wherein a first output pad of the first output pad set and a second output pad of the second output pad set are both connected to a same buffer pad of the buffer pad set.

2. The display device of claim 1, wherein if a signal is not delivered through at least one output pad among output pads included in the first output pad set, a first enable signal is input to the path change circuit, and if a signal is not delivered through at least one output pad among output pads included in the second output pad set, a second enable signal is input to the path change circuit.

3. The display device of claim 2, wherein when the first enable signal is input to the path change circuit, a signal delivered through the first output pad set is delivered through the buffer pad set, and when the second enable signal is input to the path change circuit, a signal delivered through the second output pad set is delivered through the buffer pad set.

4. The display device of claim 1, the path change circuit, comprising;
a first switching element connected between each output pad included in the first output pad set and each buffer pad included in the buffer pad set, and the first switching element turned on by a first enable signal; and
a second switching element connected between each output pad included in the second output pad set and each buffer pad included in the buffer pad set, and the second switching element turned on by a second enable signal.

5. The display device of claim 4, wherein when the first switching element is turned on, a signal delivered through each output pad included in the first output pad set is delivered through each buffer pad included in the buffer pad set, and
when the second switching element is turned on, a signal delivered through each output pad included in the second output pad set is delivered through each buffer pad included in the buffer pad set.

6. The display device of claim 4, further comprising:
a first enable pad disposed in the non-display area, the first enable pad connected to the first switching element, and to which the first enable signal is input; and
a second enable pad disposed in the non-display area, the second enable pad connected to the second switching element, and to which the second enable signal is input.

7. The display device of claim 1, further comprising;
a data driver mounted into the non-display area; and
a plurality of bumps disposed at the data driver and respectively connected to a plurality of pads included in the first output pad set, the second output pad set, and the buffer pad set.

8. A display device, comprising:
a first output pad set comprising a first plurality of output pads;
a second output pad set comprising a second plurality of output pads;
a buffer pad set comprising a plurality of buffer pads;
a first enable pad to which a first enable signal is input;
a second enable pad to which a second enable signal is input;
a first switching element connected to the first enable pad and respectively connected between an output pad included in the first output pad set and a buffer pad included in the buffer pad set; and
a second switching element connected to the second enable pad and respectively connected between an output pad included in the second output pad set and a buffer pad included in the buffer pad set, and
wherein when the first enable signal or the second enable signal is input, a signal delivered through the first output pad set or the second output pad set is delivered through the buffer pad set.

9. The display device of claim 8, wherein when the first enable signal is input to the first switching element through the first enable pad, a signal delivered through each output pad included in the first output pad set is delivered through each buffer pad included in the buffer pad set, and
when the second enable signal is input to the second switching element through the second enable pad, a signal delivered through each output pad included in the second output pad set is delivered through each buffer pad included in the buffer pad set.

10. The display device of claim 8, wherein if a signal is not delivered through at least one output pad among output pads included in the first output pad set, the first enable signal is input to the first enable pad, and
if a signal is not delivered through at least one output pad among output pads included in the second output pad set, the second enable signal is input to the second enable pad.

11. The display device of claim 8, wherein the first switching element is turned on by the first enable signal, and the second switching element is turned on by the second enable signal.

12. The display device of claim 8, further comprising;
a data driver; and
a plurality of bumps disposed at the data driver and respectively connected to a plurality of pads included in the first output pad set, the second output pad set, and the buffer pad set.

13. The display device of claim 8, wherein a first data line connected to the first output pad set and a second data line connected to the second output pad set are connected to the buffer pad set through a path change circuit.

14. A display device, comprising;
a display panel comprising a display area and a non-display area;
a first output pad set disposed in the non-display area and comprising a first plurality of output pads;
a second output pad set disposed in the non-display area and comprising a second plurality of output pads;
a buffer pad set disposed in the non-display area and comprising a plurality of buffer pads; and
a path change circuit configured to change a signal delivery path such that a signal delivered through each output pad included in the first output pad set or through each output pad included in the second output pad set is delivered through each buffer pad included in the buffer pad set when an enable signal is input,
wherein a first output pad of the first output pad set and a second output pad of the second output pad set are both connected to a same buffer pad of the buffer pad set.

15. The display device of claim 14, wherein if a signal is not delivered through at least one output pad among output pads included in the first output pad set, a first enable signal is input to the path change circuit, and if a signal is not delivered through at least one output pad among output pads included in the second output pad set, a second enable signal is input to the path change circuit.

16. The display device of claim 15, wherein when the first enable signal is input to the path change circuit, a signal, delivered through the first output pad set, is delivered through the buffer pad set, and when the second enable signal is input to the path change circuit, a signal, delivered through the second output pad set, is delivered through the buffer pad set.

17. The display device of claim 14, the path change circuit, comprising;

a first switching element connected between each output pad included in the first output pad set and each buffer pad included in the buffer pad set, and the first switching element turned on by a first enable signal; and a second switching element connected between each output pad included in the second output pad set and each buffer pad included in the buffer pad set, and the second switching element turned on by a second enable signal.

18. The display device of claim 17, wherein when the first switching element is turned on, a signal delivered through each output pad included in the first output pad set is delivered through each buffer pad included in the buffer pad set, and when the second switching element is turned on, a signal delivered through each output pad included in the second output pad set is delivered through each buffer pad included in the buffer pad set.

19. The display device of claim 17, further comprising;

a first enable pad disposed in the non-display area, connected to the first switching element, and to which the first enable signal is input; and a second enable pad disposed in the non-display area, connected to the second switching element, and to which the second enable signal is input.

20. The display device of claim 14, further comprising;

a driving integrated circuit mounted into the non-display area; and a plurality of bumps disposed at the driving integrated circuit and respectively connected to a plurality of pads included in the first output pad set, the second output pad set, and the buffer pad set.

* * * * *